United States Patent
Yang

(10) Patent No.: US 8,898,374 B2
(45) Date of Patent: Nov. 25, 2014

(54) FLASH MEMORY DEVICE AND METHOD FOR MANAGING FLASH MEMORY DEVICE

(75) Inventor: Tsung-Chieh Yang, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 125 days.

(21) Appl. No.: 13/188,003

(22) Filed: Jul. 21, 2011

(65) Prior Publication Data

US 2012/0023283 A1    Jan. 26, 2012

Related U.S. Application Data

(60) Provisional application No. 61/366,201, filed on Jul. 21, 2010.

(30) Foreign Application Priority Data

Feb. 1, 2011    (TW) .............................. 100103848 A

(51) Int. Cl.
*G06F 12/02* (2006.01)
*G06F 12/06* (2006.01)
*G11C 7/00* (2006.01)
*G06F 12/00* (2006.01)

(52) U.S. Cl.
CPC ............ *G06F 12/0246* (2013.01); *G06F 12/02* (2013.01); *G06F 2212/7208* (2013.01); *G06F 12/06* (2013.01); *G11C 7/00* (2013.01); *G06F 2212/7204* (2013.01); *G06F 12/00* (2013.01)
USPC ........... 711/103; 711/170; 711/119; 711/209; 365/185

(58) Field of Classification Search
CPC ...................................................... G06F 12/02
USPC ....................................................... 711/103
See application file for complete search history.

(56) References Cited

U.S. PATENT DOCUMENTS

| | | | |
|---|---|---|---|
| 7,355,892 B2 | 4/2008 | Hemink | |
| 2003/0031053 A1* | 2/2003 | Tsao et al. | 365/185.12 |
| 2008/0104309 A1* | 5/2008 | Cheon et al. | 711/103 |
| 2008/0253188 A1* | 10/2008 | Aritome | 365/185.17 |
| 2008/0316816 A1* | 12/2008 | Lin | 365/185.03 |

(Continued)

OTHER PUBLICATIONS

Office Action of corresponding TW application, published on Nov. 7, 2013.

*Primary Examiner* — Sanjiv Shah
*Assistant Examiner* — Gautam Sain
(74) *Attorney, Agent, or Firm* — Wang Law Firm, Inc.; Li K. Wang; Stephen Hsu

(57) ABSTRACT

A flash memory device includes a flash memory and a controller. The flash memory includes a single level memory module and a multi level memory module. The single level memory module includes a first data bus and at least one single level cell flash memory. Each memory cell of the single level cell flash memory stores one bit of data. The multi level memory module includes a second data bus and at least one multi level cell flash memory. Each memory cell of the multi level cell flash memory stores more than one bit of data. The first data bus is coupled to the second data bus. During a write operation, the controller writes data to the single level memory module, and the single level memory module further transmits the data to the multi level memory module through the first and second data buses coupled therebetween without passing the data through the controller.

10 Claims, 10 Drawing Sheets

(56) References Cited

U.S. PATENT DOCUMENTS

| | | | |
|---|---|---|---|
| 2010/0169604 A1* | 7/2010 | Trika et al. | 711/170 |
| 2010/0235715 A1* | 9/2010 | Thatcher et al. | 714/763 |
| 2010/0274955 A1* | 10/2010 | Lasser et al. | 711/103 |
| 2011/0149650 A1* | 6/2011 | Huang et al. | 365/185.03 |
| 2011/0153911 A1* | 6/2011 | Sprouse et al. | 711/103 |
| 2011/0153912 A1* | 6/2011 | Gorobets et al. | 711/103 |
| 2011/0208896 A1* | 8/2011 | Wakrat et al. | 711/103 |
| 2012/0014186 A1* | 1/2012 | Li | 365/185.25 |

* cited by examiner

| Sub-page type / Physical page | LSB | CSB | MSB |
|---|---|---|---|
| 0th page | 1 | 3 | 6 |
| 1st page | 2 | 5 | 9 |
| 2nd page | 4 | 8 | 12 |
| 3rd page | 7 | 11 | 15 |

FIG. 3

Order when writing data into single level memory module

| A1 | A3 | A6 | B2 | B5 | B9 | C4 | C8 | C12 | ...... |

Order when writing data into multi level memory module

| A1 | B2 | A3 | C4 | B5 | A6 | D7 | C8 | B9 | ...... |

Order when reading data from multi level memory module

| A1 | A3 | A6 | B2 | B5 | B9 | C4 | C8 | C12 | ...... |

FIG. 5

FLASH MEMORY DEVICE AND METHOD FOR MANAGING FLASH MEMORY DEVICE

CROSS REFERENCE TO RELATED APPLICATIONS

This application claims the benefit of U.S. Provisional Application No. 61/366,201, filed on Jul. 21, 2010, and claims priority of Taiwan Patent Application No. 100103848, filed on Feb. 1, 2011, the entirety of which is incorporated by reference herein.

BACKGROUND OF THE INVENTION

1. Field of the Invention

The invention relates to a flash memory controller and a flash memory access method, and more particularly to a flash memory controller and a flash memory access method capable of increasing a read and a program speed and reducing the error rate of a flash memory.

2. Description of the Related Art

NAND Flash is a non-volatile memory, thus maintaining data storage without power supply. Moreover, NAND flash has speedy program (i.e. write) and erase time. In a NAND flash, each memory cell occupies a relatively small chip area. Thus, a NAND flash has higher storage density than other memories.

Conventionally, a NAND flash memory may be grouped into single level cell (SLC) memory and multi level cell (MLC) memory, wherein the single level cell (SLC) memory may store one bit per cell, and the multi level cell (MLC) memory may store more than one bit per cell, for example, two bits per cell. As process technology advances, triple level cell (TLC) memory and quad level cell (QLC) memory devices have recently been proposed and developed to further increase the storage density of the flash memory, where the triple level cell (TLC) memory may store three bits per cell, and the quad level cell (QLC) memory may store four bits per cell.

The read or program operations of a flash memory are generally preformed in a page-wise (or called physical pages) fashion. Take a triple level cell (TLC) memory as an example; a physical page may be composed of a group of flash memory cells. Each flash memory cell may store three bits of data, including a most significant bit (MSB), a central significant bit (CSB) and a least significant bit (LSB). The three bits may correspond to three different logical pages, therefore, the three bits may have different logical addresses for host addressing. In other words, for the TLC memory, one physical page may correspond to three logical pages. Therefore, take the TLC memory as an example; each physical page may be regarded as further comprising three sub-pages, and each sub-page may correspond to one of a most significant bit (MSB), a central significant bit (CSB) and a least significant bit (LSB) of the flash memory cell, respectively. Note that the sub-pages comprised by each physical page is a logical concept. Physically, it is not necessary for a flash memory cell to have the above-mentioned sub-pages.

With the increase in storage density, the read and program time increases, accordingly. Also, the data error rate increases as the amount of bits stored in each memory cell increases. Therefore, a novel design of a flash memory controller and a flash memory access method, which can increase a read and a program speed and further reduce the error rate of a flash memory, is highly required.

BRIEF SUMMARY OF THE INVENTION

Flash memory device and method for managing a flash memory device are provided. An exemplary embodiment of a flash memory device coupled to a host for storing data comprises a flash memory and a controller. The flash memory comprises a single level memory module and a multi level memory module. The single level memory module comprises a first data bus and at least one single level cell (SLC) flash memory. Each memory cell of the SLC flash memory stores one bit of data. The multi level memory module comprises a second data bus and at least one multi level cell (MLC) flash memory. Each memory cell of the MLC flash memory stores more than one bit of data and the first data bus is coupled to the second data bus. The controller manages data access of the flash memory. During a write operation, the controller receives the data from the host, and writes the data into the SLC flash memory of the single level memory module of the flash memory. The single level memory module transmits the data stored in the SLC flash memory to the multi level memory module through the first and second data buses coupled therebetween without passing the data through the controller.

An exemplary embodiment of a method for managing a flash memory device coupled to a host, wherein the flash memory device comprises a flash memory for storing data and a controller for managing data access of the flash memory, comprises: during a write operation, receiving data from the host and writing the data to a single level memory module of the flash memory, wherein the single level memory module comprises a first data bus and at least one single level cell (SLC) flash memory, and each memory cell of the SLC flash memory stores one bit of data, and wherein the flash memory further comprises a multi level memory module, the multi level memory module comprises a second data bus coupled to the first data bus and at least one multi level cell (MLC) flash memory, and each memory cell of the MLC flash memory stores more than one bit of data; and transmitting the data stored in the SLC flash memory to the multi level memory module through the first and second data buses coupled therebetween without passing the data through the controller, so as to write the data into the MLC flash memory.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 3 is a diagram illustrating an embodiment of the anti-disturbance order;

FIG. 5 shows the read and write data orders according to an embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
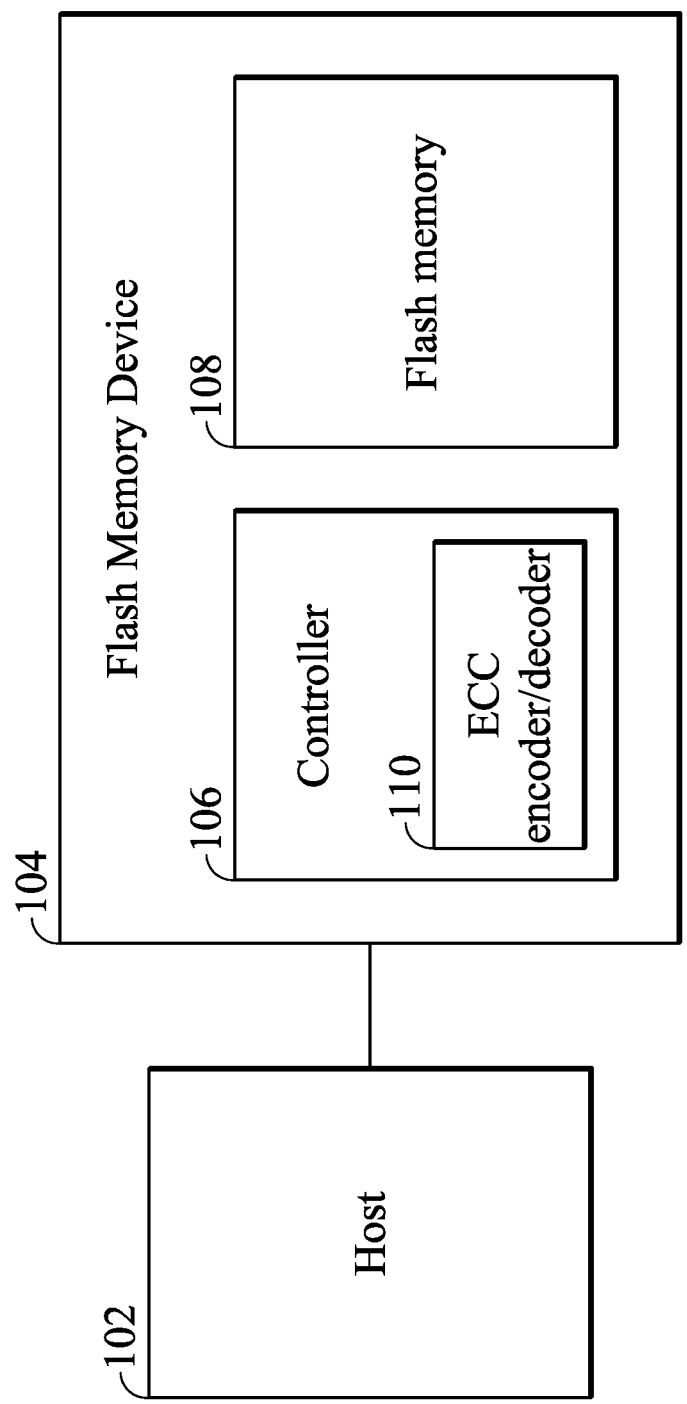
FIG. 1 is a block diagram of a flash memory device 104 according to an embodiment of the invention.

FIG. 1 is a block diagram of a flash memory device 104 according to an embodiment of the invention. The flash memory device 104 is coupled to a host 102 for storing data. In an embodiment of the invention, the flash memory device 104 may comprise a controller 106 and a flash memory 108. The controller 106 manages data access of the flash memory 108. When the host 102 would like to store data into the flash memory device 104, the controller 106 coupled to the host 102 receives data from the host 102, and writes the data into the flash memory 108. When the host 102 would like to read data from the flash memory device 104, the controller 106 reads the data from the flash memory 108 and transmits the data to the host 102.

Figure 2:
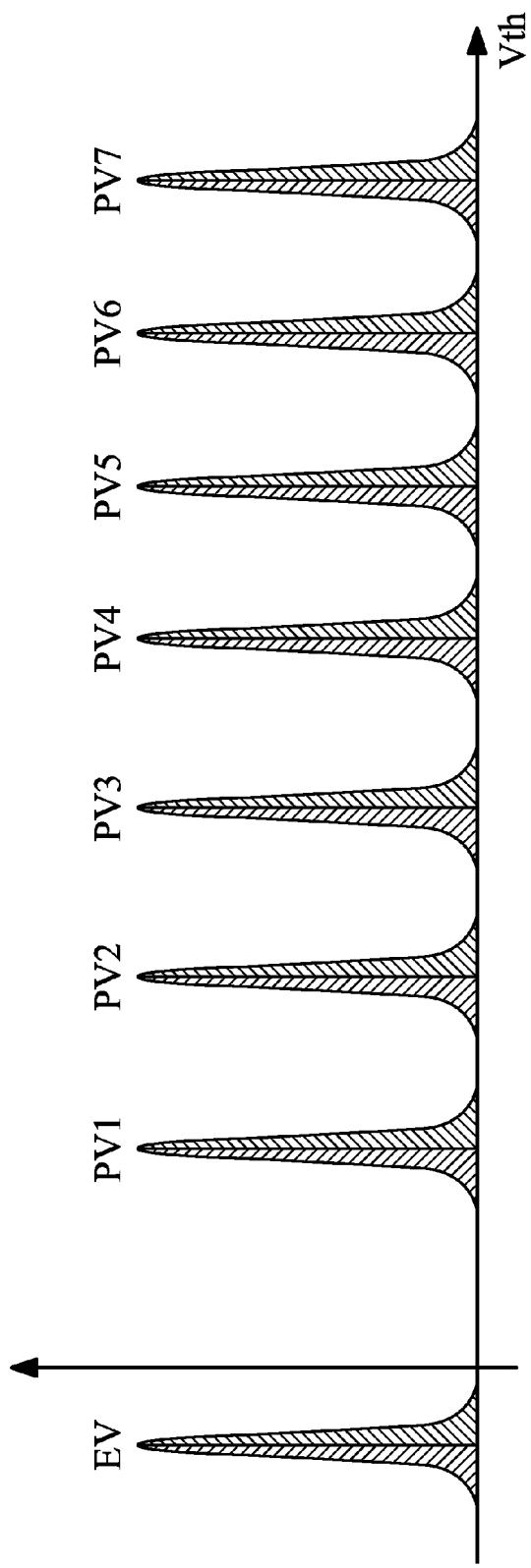
FIG. 2 shows a distribution diagram of the corresponding threshold voltages $V_{th}$ for programming a triple level cell (TLC) flash memory.

FIG. 2 shows a distribution diagram of the corresponding threshold voltages $V_{th}$ for programming a triple level cell (TLC) flash memory. Note that the TLC flash memory is merely an example, for aid in understanding the concept of the invention, and the invention should not be limited thereto. As shown in FIG. 2, with respect to the erase voltage (EV), program voltage 1 (PV1), program voltage 2 (PV2), ... and program voltage 7 (PV7), the data bits stored in the TLC flash memory may respectively be programmed to the corresponding eight states as '111', '110', '100', '101', '001', '000', '010' and '011'.

In efforts to apply a minimal amount of voltage at a time to a memory cell when writing data to the flash memory, the controller 106 generally writes the data in a progressive manner to the target memory cell. For example, take the TLC flash memory as an example, the controller 106 may first write the least significant bit (LSB), then write the central significant bit (CSB), and finally write the most significant bit (MSB). In this manner, both program accuracy and speed are improved.

However, it is unavoidable that different voltages will be repeatedly applied to a same memory cell when programming the multi level flash memory using the progressive manner (Note that in the following paragraphs, the multi level flash memory stands for the flash memory capable of storing more than one bit of data per memory cell. Therefore, the multi level flash memory may represent the aforementioned MLC, TLC, QLC or others). For example, when programming a TLC flash memory, the controller at least has to apply three voltages to a memory cell at three times, so as to respectively write the LSB, CSB and MSB thereto. Therefore, during the write process, the successive programming operation applied to the same memory cell may result in the coupling effect, which may cause the voltages of adjacent memory cells to drift. Thus, instead of programming the sub-pages of each physical page one by one, when writing data to the memory cell of a multi level flash memory, a specific sub-page order (hereinafter called an anti-disturbance order) is actually used.

FIG. 3 is a diagram illustrating an embodiment of the anti-disturbance order. Note that TLC flash memory is taken here as an example in the embodiment, where the number shown in FIG. 3 represents the programming order of each sub-page. As shown in the figure, in one embodiment, the LSB of the $0^{th}$ physical page is first programmed, and then the LSB of the $1^{st}$ physical page is next programmed. After that, the CSB of the $0^{th}$ physical page is programmed, and then the LSB of the $2^{nd}$ physical page is next programmed, and then the CSB of the $1^{st}$ physical page is next programmed, and so on. In the embodiment of the anti-disturbance order as shown, the sub-pages (i.e. the LSB, CSB and MSB) of the same physical page are not successively programmed, but programmed in an interlacing fashion by interlacing the programming operations of the sub-pages of adjacent physical pages. Such an arrangement is beneficial in that voltage drift can be corrected during the interlacing programming operations, so that voltage drift of adjacent memory cells caused by successive programming operations applied to the same memory cell is avoided.

However, note that the write order is preferably the same as the read order; otherwise, the controller has to perform an extra reorder process of data. Therefore, the interlaced programming operations required when writing data according to the above-mentioned anti-disturbance order may further cause an increase in the read time of the flash memory. To be more specific, when data is written into the flash memory according to the above-mentioned anti-disturbance order as shown in FIG. 3, the controller cannot directly obtain all the content stored in the three sub-pages of the same physical page during the three successive logical page read operations. For example, the controller cannot collect the LSB, CSB and MSB of $0^{th}$ page until the $6^{th}$ logical page read operation is completed. In other words, the controller has to read multiple physical pages so as to obtain all the data stored in the sub-page of one physical page, causing the read time to greatly increase. Therefore, a hybrid structure of the flash memory device and a novel flash memory access method with greatly improved read and write speeds and a corresponding flash memory controller utilizing the same are proposed.

Figure 4:
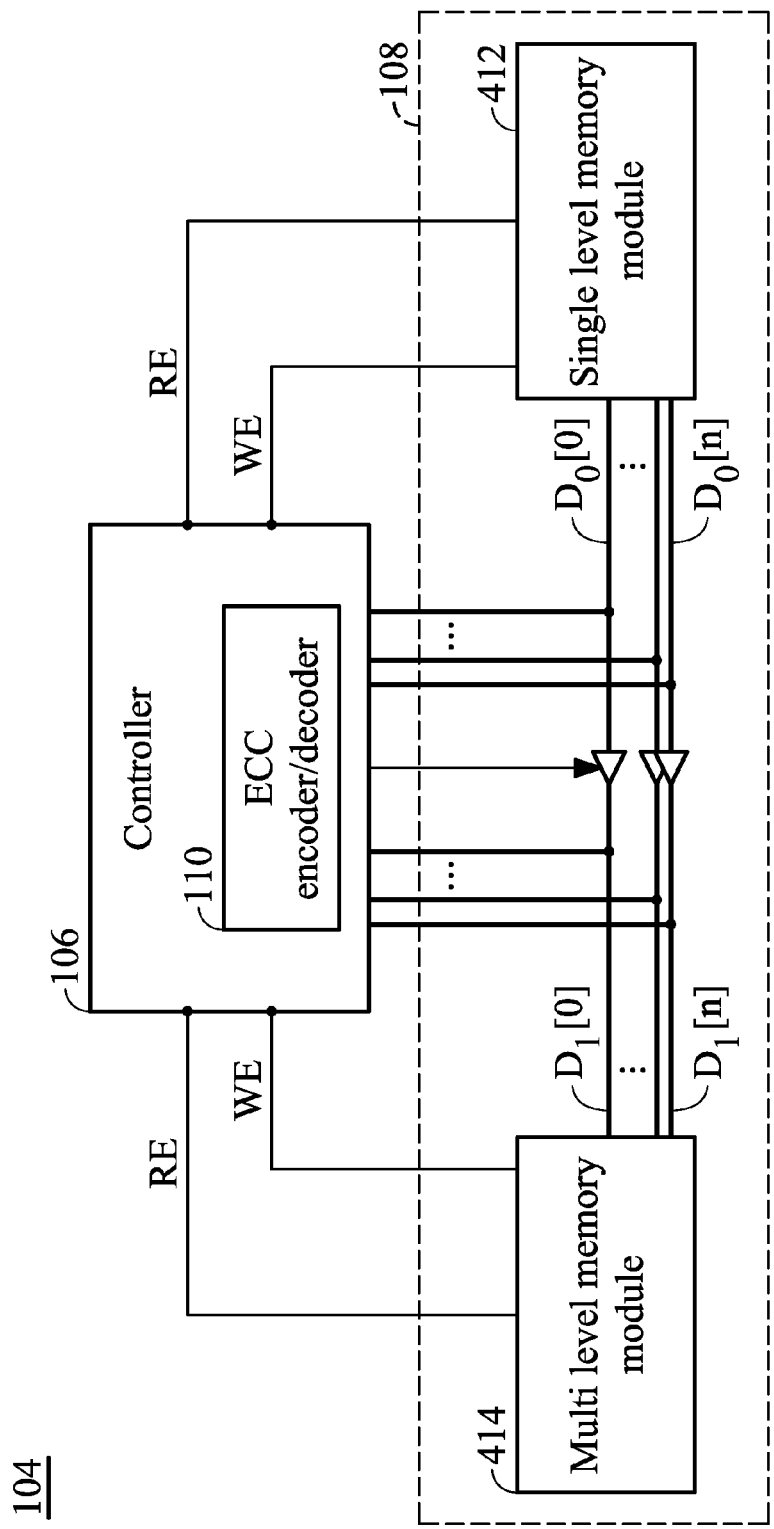
FIG. 4 is a block diagram of a flash memory device according to an embodiment of the invention.

FIG. 4 is a block diagram of a flash memory device according to an embodiment of the invention. As shown in FIG. 4, the flash memory 108 is a hybrid flash memory device, comprising a single level memory module 412 and a multi level memory module 414. The single level memory module 412 may comprise a plurality of, or at least one single level cell (SLC) flash memory, and the multi level memory module 414 may comprise a plurality of, or at least one multi level cell (MLC) flash memory. Each memory cell of the SLC flash memory stores one bit of data. Therefore, in the embodiment of the invention, the SLC flash memory is the above-mentioned SLC memory. The MLC flash memory may comprise a plurality of physical pages, wherein each physical page may comprise a plurality of sub-pages, and each sub-page stores one bit of data. In the embodiments of the invention, since each memory cell of the MLC flash memory stores more than one bit of data, the MLC flash memory may be one of the above-mentioned MLC, TLC, QLC memories, or any other flash memory capable of storing more than one bit of data per memory cell. According to an embodiment of the invention, the data bus $D_0[0] \sim D_0[n]$ of the single level memory module 412 and the data bus $D_1[0] \sim D_1[n]$ of the multi level memory module 414 are coupled together, so as to directly transmit data therebetween (details of the embodiments are illustrated in the following paragraphs).

According to an embodiment of the invention, during a write operation, the controller 106 receives data from the host 102, and writes the data into the single level memory module 412 of the flash memory 108. Because the single level memory module 412 may comprise one or more SLC flash memories, that have extremely high program speed, the controller 106 may rapidly write the data into the flash memory 108, and the write speed is greatly increased. After the single level memory module 412 has received a predetermined amount of data bits, the single level memory module 412 may begin to directly transmit the data stored therein in the background to the multi level memory module 414 through the data buses $D_0[0]$~$D_0[n]$ and $D_1[0]$~$D_1[n]$ coupled therebetween. In other words, without passing the data through the controller 106, the data stored in the single level memory module 412 may be directly transmitted to the multi level memory module 414. Note that the computation resources of the controller 106 are required.

FIG. 5 shows the data read and write orders according to an embodiment of the invention. Accompanying the anti-disturbance order as shown in FIG. 3, details of the concept of the invention are illustrated in the following paragraphs. Note that the TLC flash memory is utilized as an example in FIG. 3 and FIG. 5 to illustrate the data read and write orders of the sub-pages according to the embodiments of the invention. However, the TLC flash memory as shown is merely an example to aid in understanding the concept of the invention, and the invention should not be limited thereto As previously described, in order to reduce the interference caused by adjacent physical pages during the programming operation, instead of successively programming the sub-pages of a same physical page, it is preferably to program the sub-pages of adjacent physical pages in an interlaced fashion as the anti-disturbance order shown in FIG. 3. However, if the controller 106 read the data out from the flash memory according to the anti-disturbance order, the read speed would be low because all of the content stored in the sub-pages of a same physical page cannot be directly obtained in successive read operations.

Therefore, according to an embodiment of the invention, as shown in FIG. 5, during a write operation, the controller 106 writes the data into the single level memory module 412 according to a first data order, and the single level memory module 412 further transmits the data in the background to the multi level memory module 414 according to a second data order. And during a read operation, the controller 106 further reads the data from the multi level memory module 414 according to the first data order.

Referring to FIG. 5, the data A1, A3 and A6 shown in the figure correspond to the LSB, CSB and MSB sub-pages of the $0^{th}$ physical page, respectively, where the letter A represents the $0^{th}$ physical page. Similarly, the data B2, B5 and B9 shown in the figure correspond to the LSB, CSB and MSB sub-pages of the $1^{st}$ physical page, respectively, where the letter B represents the $1^{st}$ physical page, and so on. As shown in the first row in FIG. 5, the controller 106 writes the data into the single level memory module 412 according to the first data order (A1, A3, A6, B2, B5, B9, C4, C8, C12 . . . ). Based on the first data order, the data to be stored in the sub-pages of a same physical page of the TLC flash memory is successively written into the SLC flash memory (that is, the $0^{th}$ physical page, $1^{st}$ physical page, $2^{nd}$ physical page, . . . and so on are successively programmed). After that, as shown in the second row in FIG. 5, the single level memory module 412 transmits the data to the multi level memory module 414 in the background according to a second data order (A1, B2, A3, C4, B5, A6, D7, C8, B9 . . . ). In the embodiment, the multi level memory module 414 receives the data from the single level memory module 412 according to the above-mentioned second data order, so that the data are stored in the multi level memory module 414 according to the anti-disturbance order shown in FIG. 3 and therefore, the sub-pages of adjacent physical pages are programmed in an interlaced fashion. As previously described, such an arrangement is beneficial for correcting voltage drift, so that the voltage drift caused to adjacent memory cells by successively applying voltages on a same memory cell is avoided.

Note that the anti-disturbance order as shown in FIG. 3 is an example of various kinds of anti-disturbance orders, and is merely an example to aid in understanding the concept of the invention. Therefore, the invention should not be limited thereto. As previously described, because the SLC flash memory have extremely high program speed, the controller 106 may rapidly write the data into the flash memory 108. After the single level memory module 412 has received a predetermined amount of data bits, for example, in the embodiment, after the single level memory module 412 has received the data stored in the sub-page B2, the single level memory module 412 may begin to directly transmit the data stored therein in the background to the multi level memory module 414 through the data buses $D_0[0]$~$D_0[n]$ and $D_1[0]$~$D_1[n]$ coupled therebetween. The write operation in the background means that the data has not passed through the controller 106, and is directly transmitted from the single level memory module 412 to the multi level memory module 414.

For the controller 106, the data are written into the flash memory 108 according to the first data order. Therefore, when reading data from the flash memory 108, the controller 106 may also read out the data from the multi level memory module 414 according to the first data order (A1, A3, A6, B2, B5, B9, C4, C8, C12 . . . ), as shown in the third row in FIG. 5. Note that based on the first data order, the data stored in the sub-pages of a same physical page can be read out in sequence. That is, the controller 106 may directly obtain all of the data bits stored in the sub-pages of a same physical page after three successive read operations corresponding to that physical page. In this manner, the read speed is greatly increased. Therefore, by accompanying the proposed hybrid structure of the flash memory device and the novel flash memory access method as previously introduced, the flash memory device can not only provide faster read and write speed than the conventional designs, but the storage intensity can also be greatly increased (since the data are eventually stored in the MLC flash memory).

Figure 6:
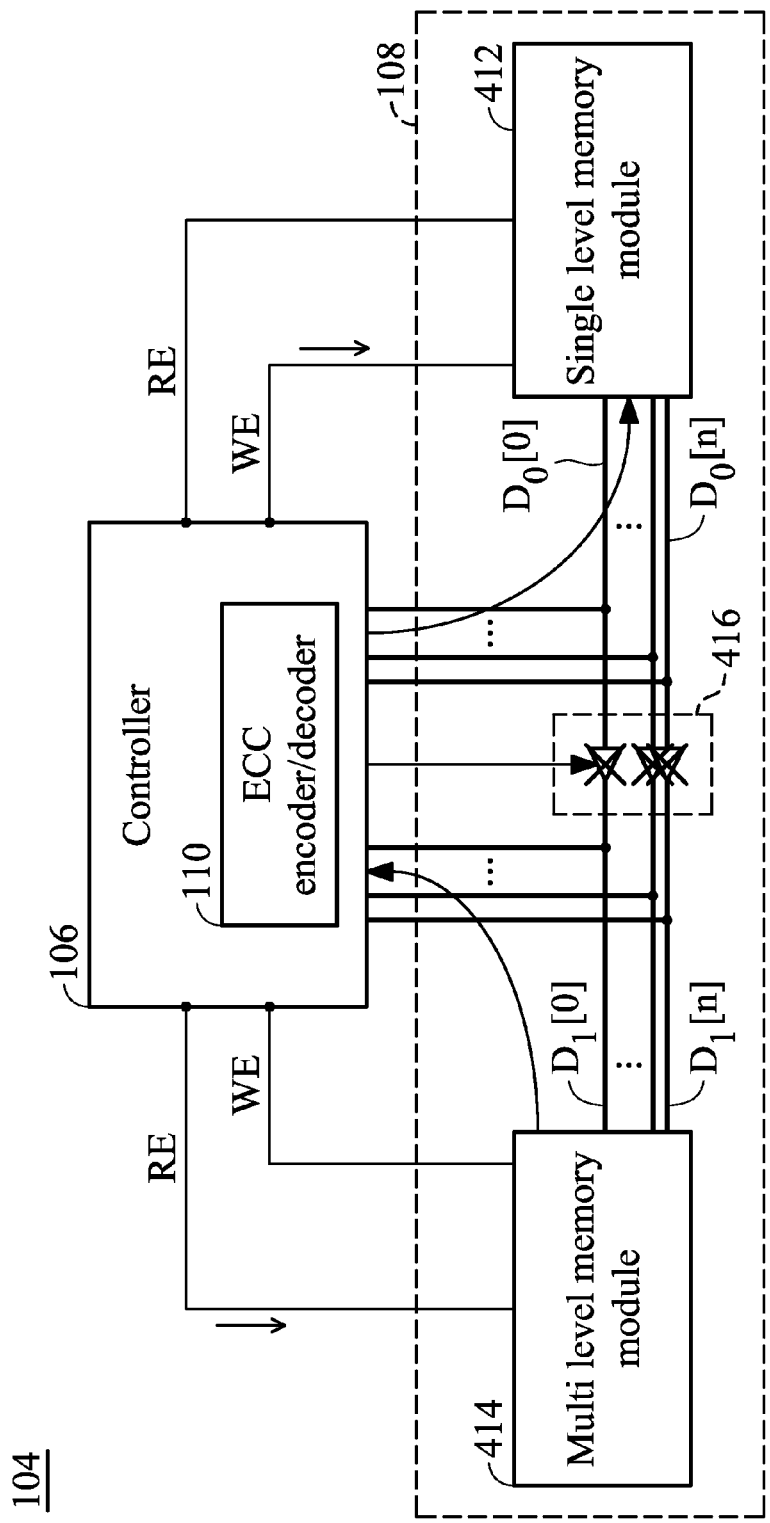
FIG. 6 shows the control signal and data flows during the normal read and write operations of the flash memory device according to an embodiment of the invention.

According to an embodiment of the invention, the controller 106 may transmit control signals to the single level memory module 412 and the multi level memory module 414 so as to manage the data access of the flash memory device. FIG. 6 shows the control signal and data flows during the normal read and write operations of the flash memory device according to an embodiment of the invention. As shown in FIG. 6, during the write operation, the controller 106 transmits a write enable WE signal and a clock signal (not shown) to the single level memory module 412 so as to write data to the single level memory module 412. During the read operation, the controller 106 transmits a read enable RE signal and a clock signal (not shown) to the multi level memory module 414 so as to read data out from the multi level memory module 414. Note that during the normal read and write operations, the controller 106 disables the gates 416 (such as buffers) between the data buses $D_0[0]$~$D_0[n]$ and $D_1[0]$~$D_1[n]$, to avoid interference from occurring to the multi level memory module 414.

Figure 7:
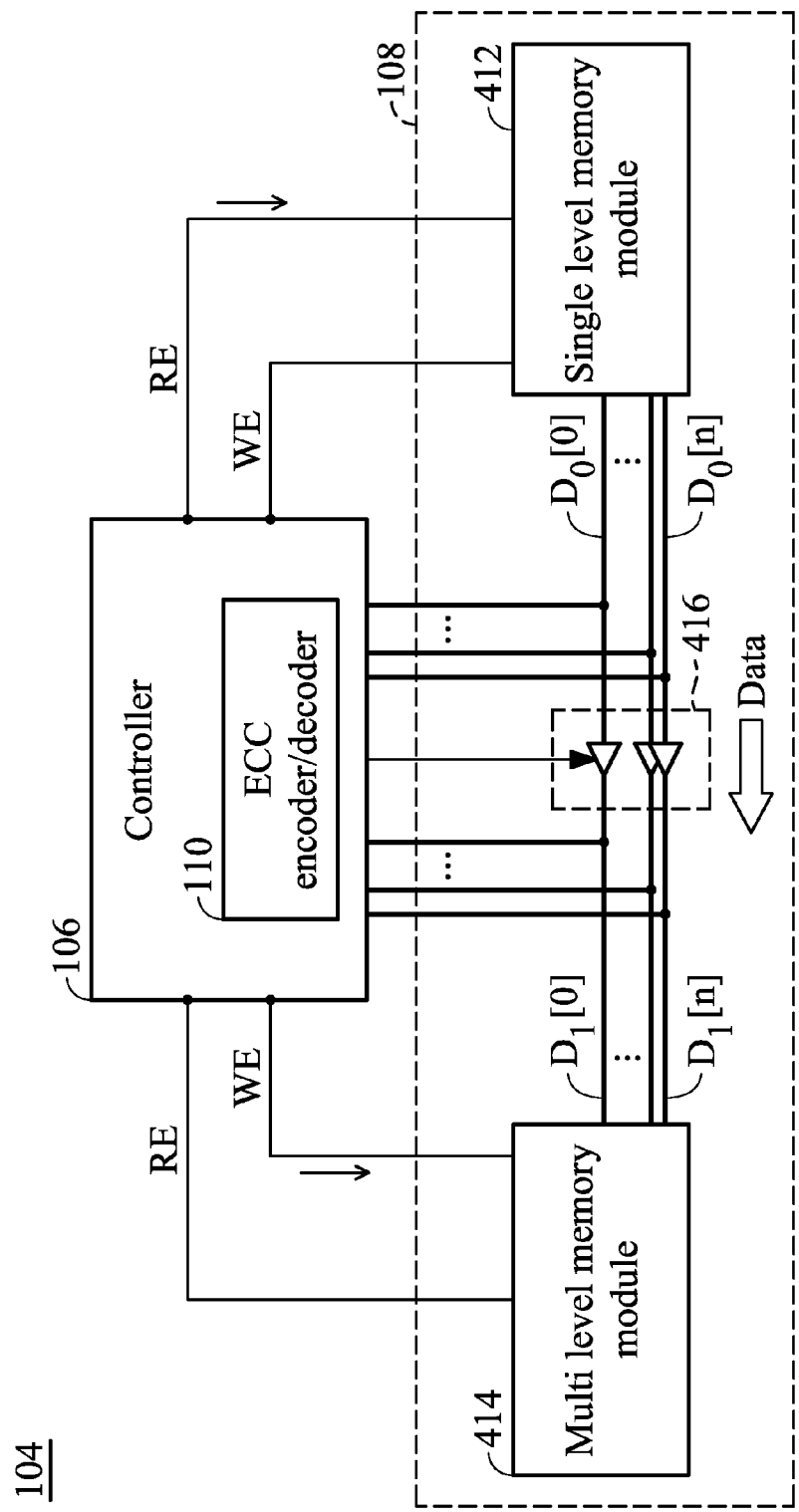
FIG. 7 shows the control signal and data flows during the background write operations of the flash memory device according to an embodiment of the invention.

FIG. 7 shows the control signal and data flows during the background write operations of the flash memory device according to an embodiment of the invention. As shown in FIG. 7, during the background write operation, the controller 106 enables the gates 416 between the data buses $D_0[0]$~$D_0[n]$ and $D_1[0]$~$D_1[n]$. The controller 106 further transmits a read enable signal (RE) and a clock signal (not shown) to the single level memory module 412, and a write enable WE signal and a clock signal (not shown) to the multi level memory module 414, so that the data are directly transmitted from the single level memory module 412 through the data buses $D_0[0]$~$D_0[n]$ and $D_1[0]$~$D_1[n]$ to the multi level memory module 414 without passing through the controller 106. In this manner, the data transmission speed is highly improved, and consumption of computation and transmission resources of the controller are reduced.

In addition, as shown in FIG. 1, the controller 106 may further comprise an error correction code (ECC) encoder/decoder 110 for encoding the data to be stored into the flash memory 108 and decoding the data read out from the flash memory 108. According to another embodiment of the invention, when the data stored in adjacent physical pages is successively read out from the multi level memory module 414 of the flash memory 108, the ECC encoder/decoder 110 decodes the read data and detects error bit(s) in the data. When the number of detected error bits exceeds a correctable error bit number, the ECC encoder/decoder 110 further derives the possible error bit(s) according to the content stored in adjacent memory cells, and further corrects the error bit(s) so as to recover the correct data content.

Generally, a correctable error bit number is pre-defined by the controller. The conventional ECC encoder/decoder corrects the error bit(s) of a sub-page when the number of detected error bits of the sub-page does not exceed the correctable error bit number. Otherwise, the conventional ECC encoder/decoder regards the sub-page as being uncorrectable and discards the sub-page.

However, according to an embodiment of the invention, since the data content stored in adjacent physical pages may be rapidly and successively read out from the multi level memory module 414 in the embodiments as previously described, when the number of error bits detected in a sub-page is determined to have exceeded a correctable error bit number, the ECC encoder/decoder 110 may further derive one or more memory cells of the physical page that has/have the possibility of having the error bit(s) occurring therein, predict the original content stored in the one or more memory cells according to the content stored in adjacent memory cell(s), and perform ECC decoding of the physical page again according to the predicted original content, so as to correct the error bit(s) and recover the original data content of the memory cell.

Figure 8:
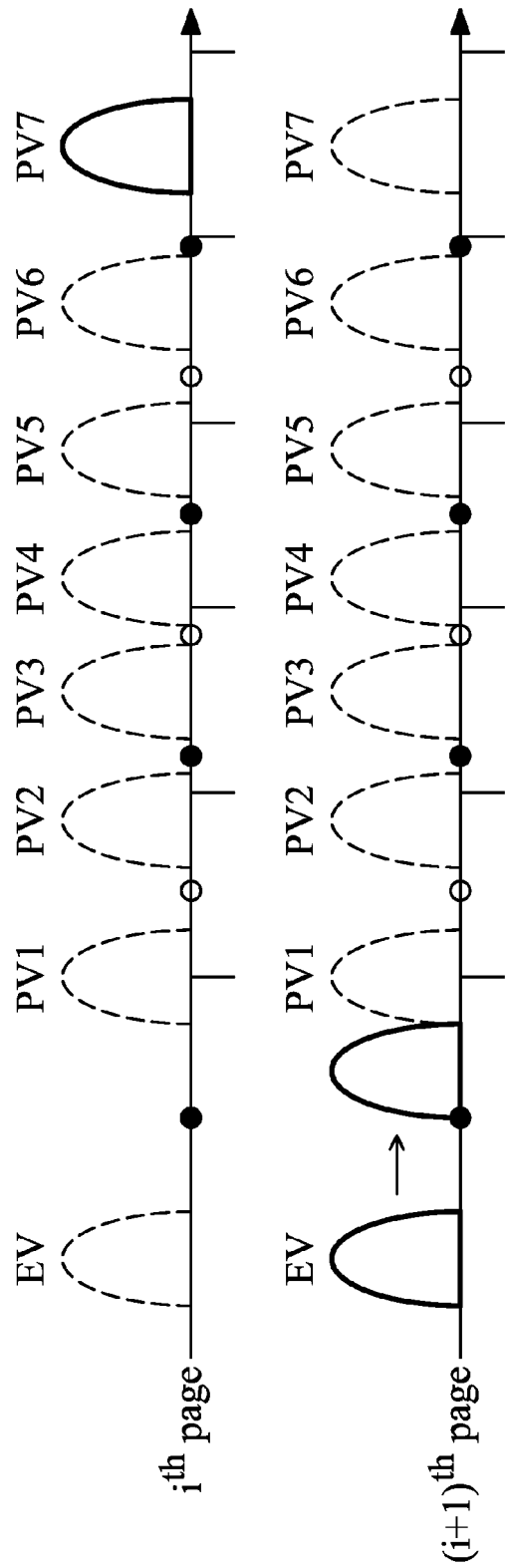
FIG. 8 is a schematic diagram showing the voltage drift of the memory cell caused by an adjacent aggressor.

According to an embodiment of the invention, the controller 106 may first define the logical state(s) (hereinafter called the aggressor) that would have the greatest influence on the other stored logical states. Take the TLC flash memory as an example, FIG. 8 is a schematic diagram showing the voltage drift of the memory cell caused by an adjacent aggressor. As shown in FIG. 8, one memory cell of an $i^{th}$ physical page is programmed to PV7, which is the highest voltage among the logical states. In other words, a maximum voltage is applied to the memory cell for programming the memory cell to the corresponding logical state. Therefore, during the programming process, the applied high voltage may cause voltage drift on the adjacent memory cells in the adjacent $(i+1)^{th}$, $(i-1)^{th}$, $(i+2)^{th}$, $(i-2)^{th}$, and/or other physical pages. To be more specific, the applied high voltage may cause the programmed voltage to drift from EV to close to PV1, thereby bit errors may occur. Therefore, the controller 106 may define the memory cell that is programmed to the state PV7 as an aggressor.

In an embodiment of the invention, when the ECC encoder/decoder 110 determines that a number of error bits detected in a logical page (corresponding to a sub-page) have exceeded a correctable error bit number, the ECC encoder/decoder 110 may first find out whether there is any aggressor existing among the adjacent physical pages. When there is an aggressor existing in the adjacent physical pages, the ECC encoder/decoder 110 derives the error bit(s) possibly occurring in the memory cell adjacent to (for example, physically adjacent to) the aggressor. Next, the ECC encoder/decoder 110 further predicts the original content stored in the memory cell adjacent to the aggressor according to the content stored in the aggressor, corrects the possibly error data bit(s) in the memory cell according to the predicted original content, and perform ECC decoding again, so as to correct the error bit(s) and recover the original data content of the memory cell. In an embodiment of the invention, the ECC encoder/decoder 110 may first find out the memory cell programmed at the highest voltage (such as PV7) in adjacent physical pages. For example, ECC decoding error may have occurred in one sub-page (such as the MSB) of the $k^{th}$ physical page. The ECC encoder/decoder 110 may find out that the $1^{st}$, $3^{rd}$ and $5^{th}$ memory cells in the $(k+1)^{th}$ physical page are programmed to the highest voltage, and find out that the $7^{th}$ and $9^{th}$ memory cells in the $(k-1)^{th}$ physical page are programmed to the highest voltage. The ECC encoder/decoder 110 may regard the memory cells programmed to the highest voltage as the aggressors. The ECC encoder/decoder 110 may further correct the content read from the $1^{st}$, $3^{rd}$, $5^{th}$, $7^{th}$ and $9^{th}$ memory cells of the $k^{th}$ physical page according to the content of the corresponding aggressors. For example, before correction, the states of the $1^{st}$, $3^{rd}$, $5^{th}$, $7^{th}$ and $9^{th}$ memory cells of the $k^{th}$ physical page read out by the controller 106 may respectively be PV1, PV2, PV1, PV1 and PV1. Because the programmed voltages of the memory cells may be pulled up by the influence of the high voltage programmed to the aggressors, the ECC encoder/decoder 110 may predict that the original programmed states of the corresponding memory cells may be PV0, PV1, PV0, PV0 and PV0. Therefore, the ECC encoder/decoder 110 may correct the MSB of the corresponding memory cells, and perform ECC decoding again so as to check the correctness of the predictions.

In another embodiment of the invention, suppose that the correctable error bit number of a sub-page defined by the controller 106 is 68 bits and the ECC encoder/decoder 110 has detected 100 error bits occurring in an MSB sub-page when decoding the MSB sub-page, the ECC encoder/decoder 110 can not directly perform error correction since the number of detected error bits exceeds the correctable error bit number. Therefore, the ECC encoder/decoder 110 will start to find out whether there is any aggressor existing in the adjacent physical pages. When the ECC encoder/decoder 110 finds out that there are more than 32 memory cells adjacent to the aggressors, the ECC encoder/decoder 110 may further predict the original content stored in the memory cells adjacent to the aggressors according to the content stored in the aggressors based on the concept shown in FIG. 8, correct the possibly error data bits in the memory cell according to the predicted original content, and perform ECC decoding again. When the errors have indeed occurred in the memory cells adjacent to the aggressor, the number of detected error bits can be reduced to be less than the correctable error bit number after correcting for the possible error bits as previously described. In this manner, the ECC encoder/decoder 110 may further perform ECC decoding according to the corrected content, so as to correct all of the error bits and recover the original content of the physical page.

When the ECC encoder/decoder 110 cannot find more than 32 memory cells adjacent to the aggressors, the ECC encoder/decoder 110 may loosen the definition of the aggressor. For example, the ECC encoder/decoder 110 may also regard the memory cell that is programmed to the state PV6 as an aggressor, find out the memory cells adjacent to the aggressors based on the looser definition again, and further predict possible error bits, correct the possible error bits and check the correctness of the predictions as previously described. The definition of aggressor may still be amended and the above-mentioned process may be repeated again when the ECC encoder/decoder 110 still cannot find more than 32 memory cells adjacent to the aggressors. For example, the memory cell that is programmed to the state PV7 in adjacent physical page (that is, a physical page adjacent to the physical page where the sub-page belongs) may also be regarded as the aggressor, and the ECC encoder/decoder 110 may further predict possible error bits, correct the possible error bits and check the correctness of the predictions as previously described. For another example, the range of memory cells affected by the aggressors may also be extended, or the memory cells adjacent to the memory cells that are adjacent to the aggressors in a same physical page may also be considered as the memory cells that may possibly have error bits occurring therein, and the ECC encoder/decoder 110 may further predict possible error bits, correct the possible error bits and check the correctness of the predictions as previously described. By repeatedly amending the definition of aggressors and the range of memory cells affected by the aggressors, the correct data content of the physical page can be recovered. Note that there is no specific rule or order for amending the definition of aggressors and the range of memory cells affected by the aggressors, and those with ordinary skilled in the art may arbitrarily perform amendments according to the teachings of the invention.

Figure 9:
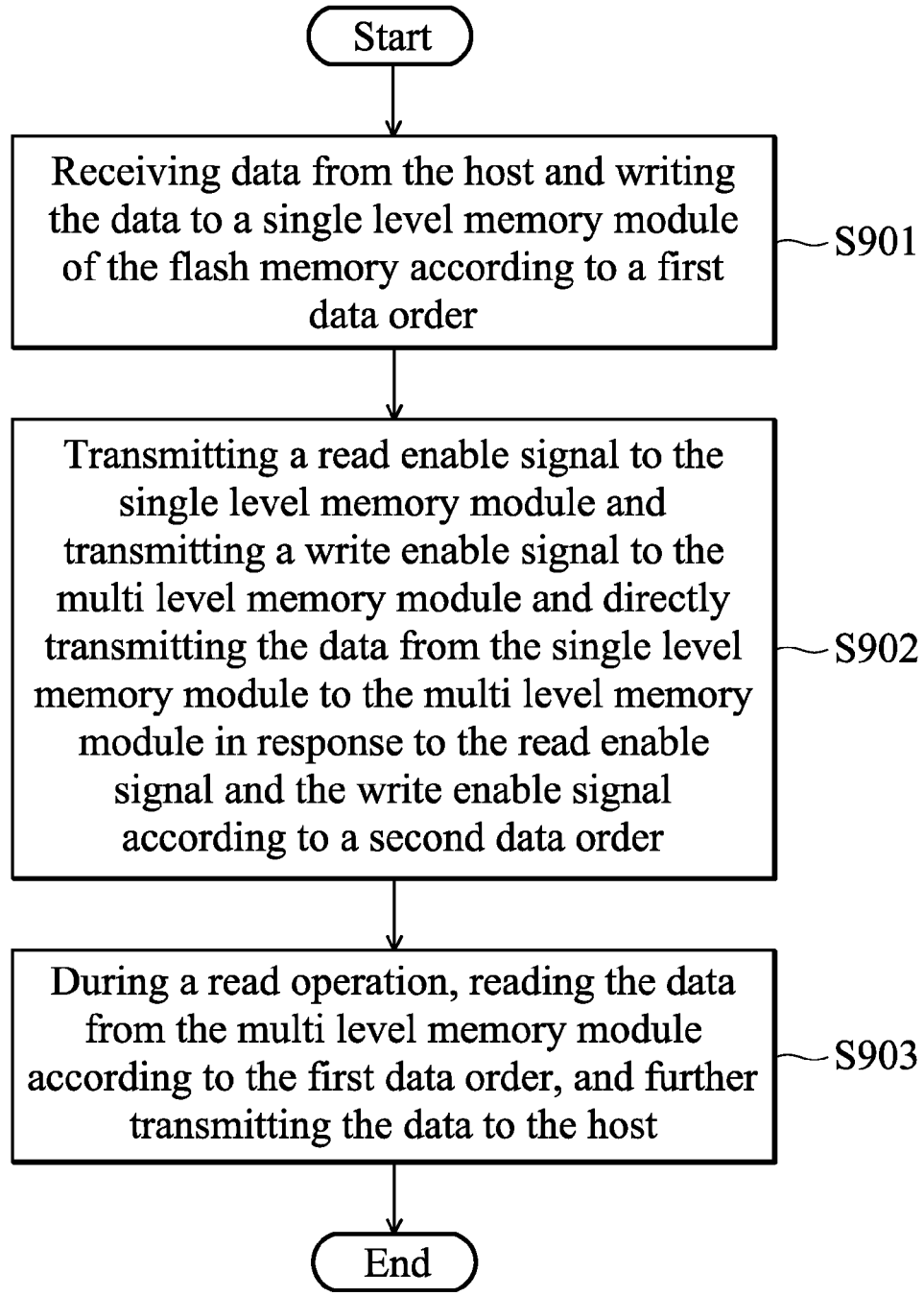
FIG. 9 shows a flow chart of a method for managing a flash memory device according to an embodiment of the invention.

In summary, FIG. 9 shows a flow chart of a method for managing a flash memory device according to an embodiment of the invention. To begin, during a write operation, data is received from the host and written into a single level memory module of the flash memory according to a first data order (Step S901). Next, a read enable signal is transmitted to the single level memory module and a write enable signal is transmitted to the multi level memory module, and the data is directly transmitted from the single level memory module to the multi level memory module in response to the read enable signal and the write enable signal according to a second data order (Step S902) so that the data is stored in the multi level memory module without passing through the controller. Finally, during a read operation, the data is read out from the multi level memory module according to the first data order, and further transmitted to the host (Step S903).

Figure 10:
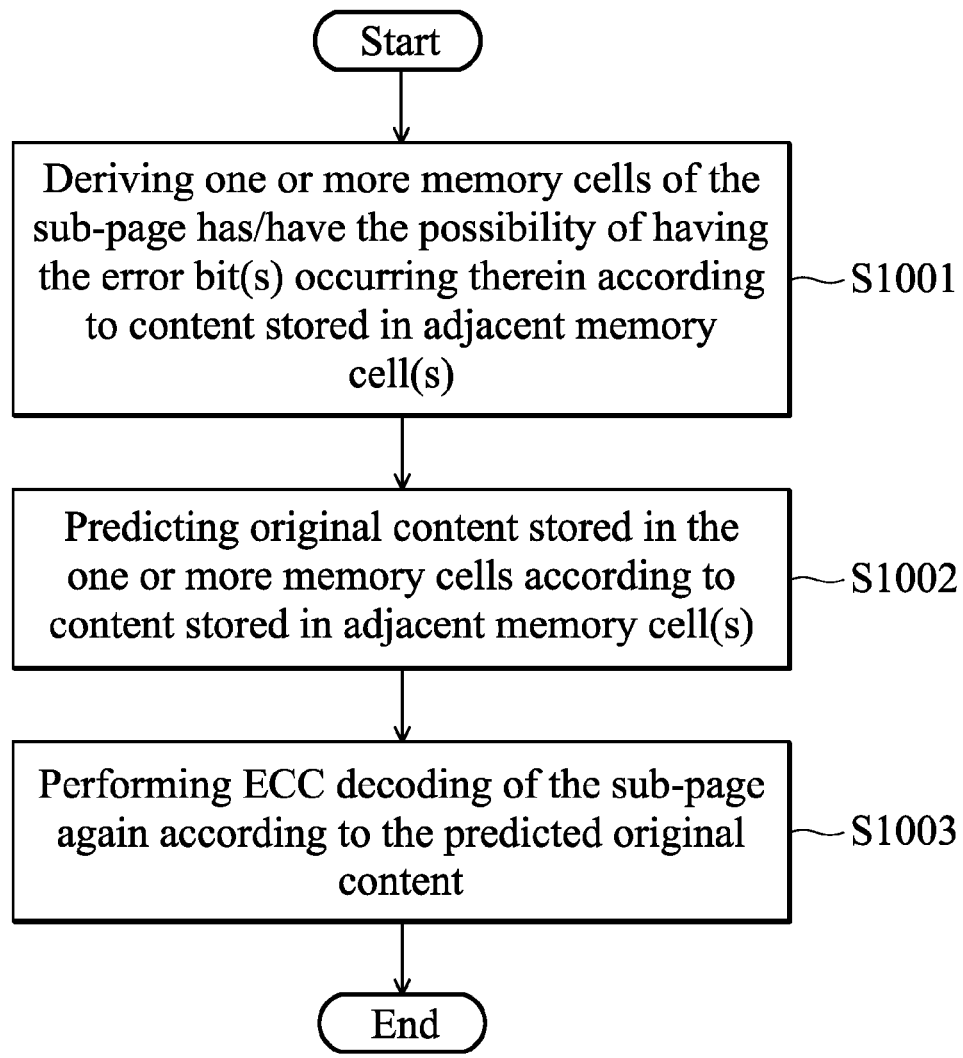
FIG. 10 shows another flow chart of a method for managing a flash memory device according to another embodiment of the invention.

FIG. 10 shows another flow chart of a method for managing a flash memory device according to another embodiment of the invention. In the embodiments of the invention, during a decoding process after reading data from the flash memory device, when a number of error bits detected in a sub-page of a physical page is determined to have exceeded a correctable error bit number, one or more memory cells of the sub-page that has/have the possibility of having the error bit(s) occurring therein is/are first derived according to the content stored in adjacent memory cell(s) (Step S1001). Next, original content stored in the one or more memory cells is predicted according to the content stored in adjacent memory cell(s) (Step S1002). Finally, ECC decoding of the sub-page is performed again according to the predicted original content (Step S1003).

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A flash memory device, coupled to a host for storing data, comprising:
   a flash memory, comprising:
      a single level memory module, comprising a first data bus and at least one single level cell (SLC) flash memory, wherein each memory cell of the SLC flash memory stores one bit of data;
      a multi level memory module, comprising a second data bus and at least one multi level cell (MLC) flash memory, wherein each memory cell of the MLC flash memory stores more than one bit of data, and the first data bus is coupled to the second data bus; and
      a controller, for managing data access of the flash memory, receiving the data to be stored in the flash memory from the host and transmitting the data read out from the flash memory to the host, wherein during a write operation, the controller receives the data from the host, and writes the data into the SLC flash memory of the single level memory module of the flash memory according to a first data order, and
   wherein the single level memory module transmits the data stored in the SLC flash memory to the multi level memory module according to a second data order through the first and second data buses coupled therebetween without passing the data through the controller, and during a read operation for reading the data, the controller further reads the data from the multi level memory module according to the first data order,
   wherein the first data order is different from the second data order, and
   wherein the controller further comprises an error correction code encoder/decoder for encoding the data to be stored into the flash memory and decoding the data read out from the flash memory, wherein during a decoding process, when a number of error bits detected in a sub-page of a physical page is determined to have exceeded a correctable error bit number, the error correction code encoder/decoder further derives one or more memory cells of the physical page that has/have the possibility of having the error bit(s) occurring therein, predicts original content stored in the one or more memory cells according to the content stored in adjacent memory cell(s), and performs error correction code decoding of the physical page again according to the predicted original content, wherein the one or more memory cells of the physical page that has/have the possibility of having the error bit(s) occurring therein is/are derived when there is a memory cell that is programmed to a logical state that has great influence on the other stored logical states exists in adjacent physical page(s).

2. The flash memory device as claimed in claim 1, wherein the controller transmits a read enable signal to the single level memory module, and transmits a write enable signal to the multi level memory module, so that the data are directly transmitted from the single level memory module to the multi level memory module without passing the data through the controller.

3. The flash memory device as claimed in claim 1, wherein during a read operation, the controller reads the data from the multi level memory module, and transmits the data to the host.

4. The flash memory device as claimed in claim 1, wherein the MLC flash memory comprises a plurality of physical pages, and each physical page comprises a plurality of sub-pages, and according to the first data order, the data stored in the sub-pages of a same physical page are successively read.

5. The flash memory device as claimed in claim 4, wherein according to the second data order, the sub-pages of adjacent physical pages are written in an interlaced fashion, so as to avoid successively writing to a same physical page that would cause interference to the adjacent physical pages.

6. A method for managing a flash memory device coupled to a host, wherein the flash memory device comprises a flash memory for storing data and a controller for managing data access of the flash memory, receiving data to be stored in the flash memory device from the host for the host to store the data in the flash memory device and transmitting the data read out from the flash memory device to the host for the host to read the data from the flash memory device, comprising:

during a write operation, receiving data from the host and writing the data to a single level memory module of the flash memory, wherein the single level memory module comprises a first data bus and at least one single level cell (SLC) flash memory, the data is written into the SLC flash memory according to a first data order, and each memory cell of the SLC flash memory stores one bit of data, and wherein the flash memory further comprises a multi level memory module, the multi level memory module comprises a second data bus coupled to the first data bus and at least one multi level cell (MLC) flash memory, and each memory cell of the MLC flash memory stores more than one bit of data;

transmitting the data stored in the SLC flash memory to the multi level memory module according to a second data order through the first and second data buses coupled therebetween without passing the data through the controller, so as to write the data into the MLC flash memory, and during a read operation, reading the data from the multi level memory module according to the first data order, wherein the first data order is different from the second data order, wherein the step of writing the data to the single level memory module further comprises:
 writing the data into the flash memory according to an error correction code, and
wherein the step of reading the data from the multi level memory device further comprises:
 decoding the data according to the error correction code;
 when a number of error bits detected in a sub-page of a physical page is determined to have exceeded a correctable error bit number during a decoding process, deriving one or more memory cells of the physical page that has/have the possibility of having the error bit(s) occurring therein according to content of the memory cell(s) in adjacent physical page(s), wherein the one or more memory cells of the physical page that has/have the possibility of having the error bit(s) occurring therein is/are derived when there is a memory cell that is programmed to a logical state that has great influence on the other stored logical states exists in the adjacent physical page(s);
 predicting original content stored in the one or more memory cells according to the content stored in the adjacent memory cell(s); and
 performing error correction code decoding of the physical page again according the predicted original content.

7. The method as claimed in claim 6, further comprising:
transmitting a read enable signal to the single level memory module;
transmitting a write enable signal to the multi level memory module; and
directly transmitting the data from the single level memory module to the multi level memory module according to the read enable signal and the write enable signal.

8. The method as claimed in claim 6, further comprising:
during a read operation, reading the data from the multi level memory module, and further transmitting the data to the host.

9. The method as claimed in claim 6, wherein according to the first data order, the data stored in a plurality of sub-pages of a physical page of the MLC flash memory are successively read.

10. The method as claimed in claim 6, wherein according to the second data order, the data is written into a plurality of sub-pages of adjacent physical pages of the MLC flash memory in an interlaced fashion.

* * * * *